United States Patent
Lee (10) Patent No.: US 9,105,667 B2
(45) Date of Patent: Aug. 11, 2015

(54) SEMICONDUCTOR DEVICE HAVING POLYSILICON MASK LAYER

(71) Applicant: MACRONIX INTERNATIONAL CO., LTD., Hsinchu (TW)

(72) Inventor: Guanru Lee, Kaohsiung (TW)

(73) Assignee: MACRONIX INTERNATIONAL CO., LTD. (TW)

( * ) Notice: Subject to any disclaimer, the term of this patent is extended or adjusted under 35 U.S.C. 154(b) by 156 days.

(21) Appl. No.: 13/928,002

(22) Filed: Jun. 26, 2013

(65) Prior Publication Data
US 2014/0264352 A1 Sep. 18, 2014

Related U.S. Application Data

(60) Provisional application No. 61/781,011, filed on Mar. 14, 2013.

(51) Int. Cl.
| | | |
|---|---|---|
| *H01L 29/00* | (2006.01) | |
| *H01L 29/792* | (2006.01) | |
| *H01L 29/66* | (2006.01) | |
| *H01L 29/04* | (2006.01) | |
| *H01L 27/108* | (2006.01) | |
| *H01L 29/423* | (2006.01) | |
| *H01L 21/311* | (2006.01) | |
| *H01L 27/115* | (2006.01) | |

(52) U.S. Cl.
CPC ..... *H01L 29/66833* (2013.01); *H01L 21/31144* (2013.01); *H01L 27/10876* (2013.01); *H01L 27/11582* (2013.01); *H01L 29/04* (2013.01); *H01L 29/4236* (2013.01); *H01L 29/66621* (2013.01)

(58) Field of Classification Search
CPC ............... H01L 29/66621; H01L 29/4236; H01L 27/10876; H01L 29/66545; H01L 27/11578; H01L 29/407; H01L 29/66553; H01L 29/66734; H01L 27/11551; H01L 29/0649; H01L 29/518; H01L 29/04
USPC ............ 257/324, 330, 316, 368, 506, 510
See application file for complete search history.

(56) References Cited

U.S. PATENT DOCUMENTS

| | | | | |
|---|---|---|---|---|
| 5,146,426 | A * | 9/1992 | Mukherjee et al. | 257/316 |
| 5,315,142 | A * | 5/1994 | Acovic et al. | 257/316 |
| 2008/0003743 | A1 * | 1/2008 | Lee | 438/257 |
| 2011/0291175 | A1 * | 12/2011 | Jee et al. | 257/316 |

FOREIGN PATENT DOCUMENTS

TW 201242012 10/2012

OTHER PUBLICATIONS

Office Action dated Mar. 25, 2015 for Taiwan Patent Application No. 102128793.

* cited by examiner

*Primary Examiner* — Shouxiang Hu
(74) *Attorney, Agent, or Firm* — Baker & McKenzie LLP (57) ABSTRACT

A semiconductor device includes a first semiconductor layer, a second semiconductor layer and a third semiconductor layer. The second semiconductor layer is formed over the first semiconductor layer and includes a recess in a vertical direction towards the first semiconductor layer. The third semiconductor layer is formed in the recess of the second semiconductor layer and includes a seam or void in the recess.

12 Claims, 11 Drawing Sheets

FIG. 6D

SEMICONDUCTOR DEVICE HAVING POLYSILICON MASK LAYER

CROSS-REFERENCE TO RELATED APPLICATIONS

This application claims priority to U.S. Provisional App. Ser. No. 61/781,011, filed Mar. 14, 2013, which is hereby incorporated by reference in its entirety.

BACKGROUND

The present application relates generally to mask layers in semiconductor devices such as 3D memory devices fabricated with silicon-nitride and polysilicon hard masks.

The reduction in size of memory devices such as 3D memory devices has caused the aspect ratio (e.g., ratio of height to width) of structures to increase. High aspect ratio structures can lose structural stability and bend. Such bending can cause poor device formation or even short circuits that can result in complete device failure.

There is a need for improved processes and structures for the formation of high aspect ratio structures.

BRIEF SUMMARY

In an embodiment, a semiconductor device includes a semiconductor layer, an oxide layer and a polysilicon layer. The oxide layer is formed over the semiconductor layer and includes a recess in a vertical direction towards the semiconductor layer. The polysilicon layer is formed in the recess of the oxide and includes a seam or void in the recess.

In another embodiment, a method for fabricating a semiconductor device includes: providing a first semiconductor layer; forming a second semiconductor layer over the first semiconductor layer; forming a first hard mask layer over the second semiconductor layer; patterning the first hard mask layer; etching the second semiconductor layer using the first hard mask layer; removing the first hard mask layer; forming a second hard mask layer, at least a portion of the second hard mask layer being disposed in a same location from which the first hard mask layer was removed, and the second hard mask layer including a void or a seam.

DETAILED DESCRIPTION

Figure 1:
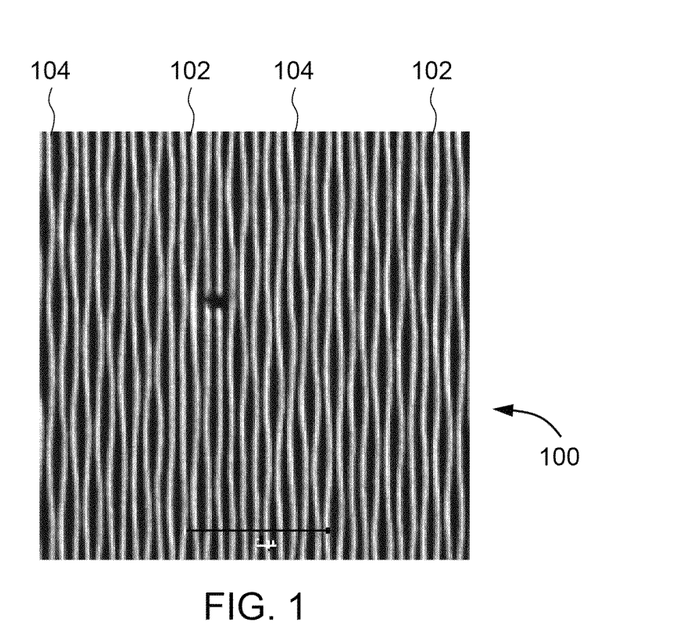
FIG. 1 is a top view of an exemplary semiconductor device.

FIG. 1 shows a top view of an exemplary semiconductor device 100. The semiconductor device 100 includes upwardly protruding features 102 and recesses 104. To form the protruding features 102, a mask layer is formed over a semiconductor layer and patterned and an etching process is performed. After etching, the protruding features 102 are wavy and bent. The shrinking pitch and increasing stacked layers associated with reduction in size of semiconductor devices, for example in bit lines in memory devices, contributes to bending. This may be caused by the mask layer and/or the semiconductor layer having a poor tensile strength. For example, the semiconductor layer may be an oxide layer and the mask layer may be a polysilicon layer. Oxide and polysilicon may be considered compressive materials having a tensile strength of −300 Mpa and −200 Mpa respectively.

Figure 2:
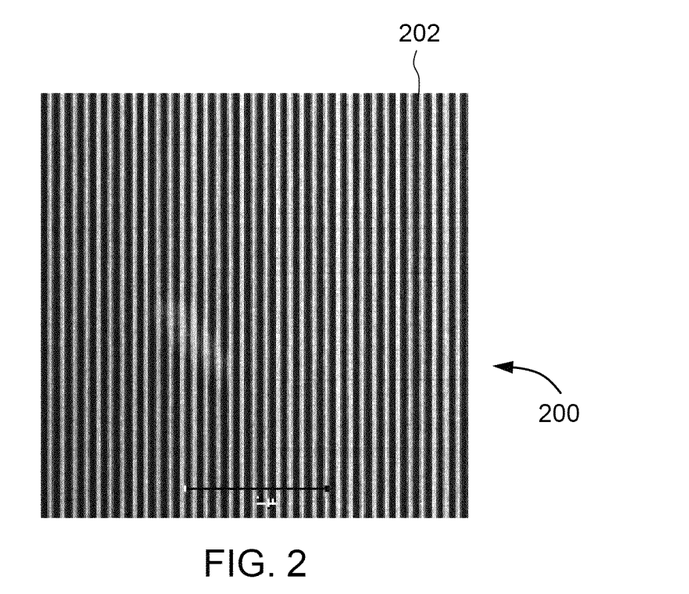
FIG. 2 is a top view of an exemplary semiconductor device.

Referring to FIG. 2, the semiconductor device 200 is formed in a process similar to that described with respect to the semiconductor device 100 where at least one of the mask layer and the semiconductor layer include a material having a high tensile strength. The high tensile strength material allows for the protruding features 202 to resist bending. For example, silicon nitride, which may be considered a tensile material having a tensile strength of 1000 Mpa, may be used for the mask layer.

Although the use of silicon nitride in a mask layer has advantages in the formation of high aspect ratio devices, it has not been used for devices such as 3D memory devices due to its poor selectivity to oxide. Silicon nitride and oxide are similar materials and therefore selectivity between silicon nitride and oxide is poor. Other materials, such as polysilicon, are different from silicon nitride and therefore have better selectivity. However, if polysilicon, which has better selectivity to oxide, is used for a mask layer, it may be susceptible to bending, stringers and residues in high aspect ratio devices.

FIG. 3 shows a cross-sectional view of an exemplary semiconductor device 300. It will be appreciated that the semiconductor device 300 is illustrative in nature and relates generally to 3D memory such as floating gate memory, charge trapping memory, and other non-volatile memory devices as well as semiconductor devices generally. The semiconductor device 300 includes a buried oxide 302. Stacked layers 304 are formed over the buried oxide 302. The stacked layers 304 may be alternating oxide and polysilicon layers to form a oxide/poly/oxide, oxide/poly/oxide/poly/oxide, etc structure such as may be used in 3D memory devices.

Figure 3A:
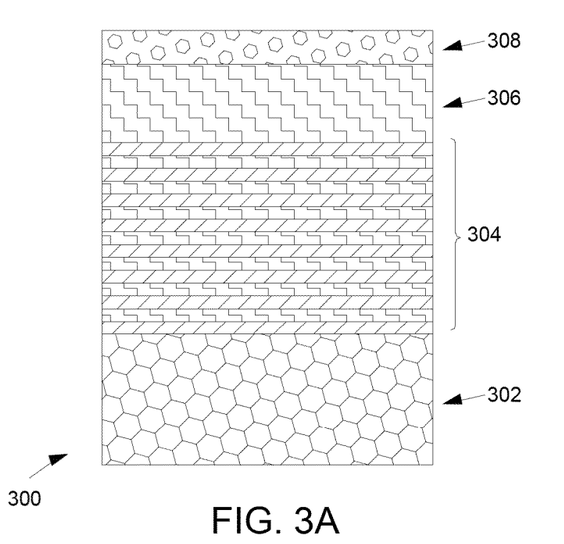
FIGS. 3A-3G are cross-sectional views of an exemplary semiconductor device.

A top oxide layer 306 may be thicker than oxide layers included in the stacked layer 304. A hard mask layer 308 is formed over the top oxide layer 306. The hard mask layer 308 preferably has a high tensile strength and may be a silicon nitride layer.

Figure 3B:
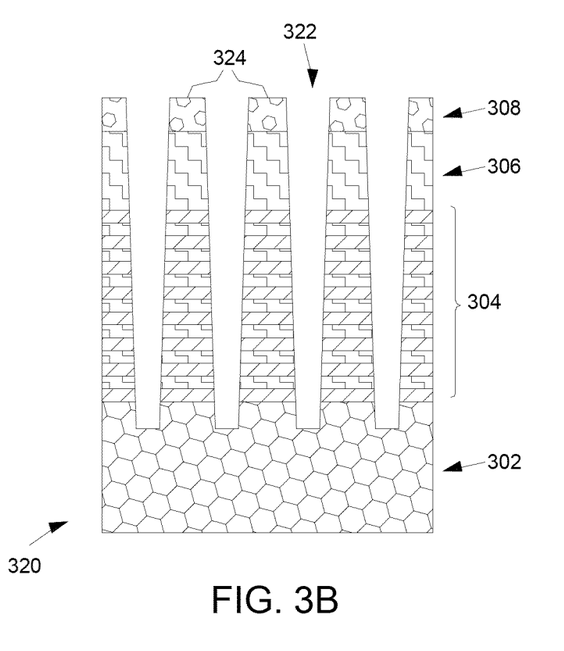

Referring to FIG. 3B, the hard mask layer 308 is patterned and an etch is performed to provide the semiconductor device 320. The semiconductor device 320 includes the recesses 322 formed by the etching process. The high tensile strength of the hard mask layer 308 resists bending in the protruding features 324.

Figure 3C:
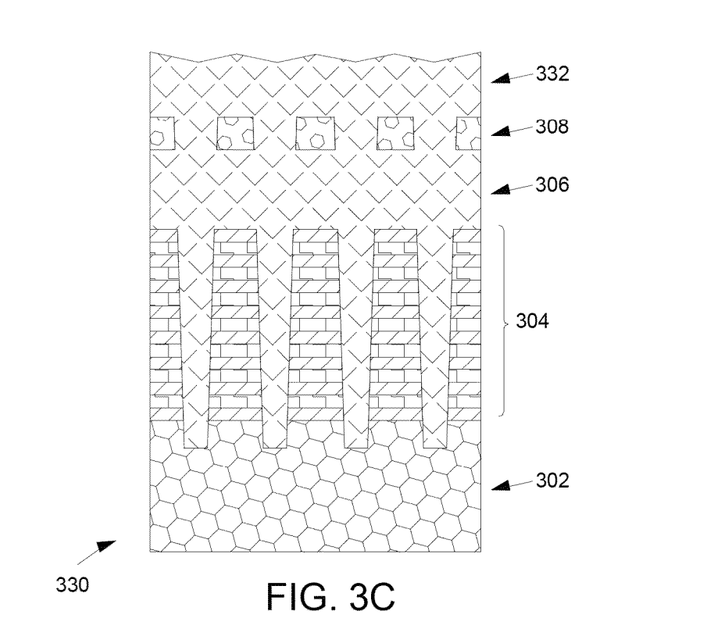

Referring to FIG. 3C, an oxide layer 332 is formed over the semiconductor device 320 to provide the semiconductor device 330. The recesses 322 shown in FIG. 3B are substantially or completely filled by the oxide layer 332.

Figure 3D:
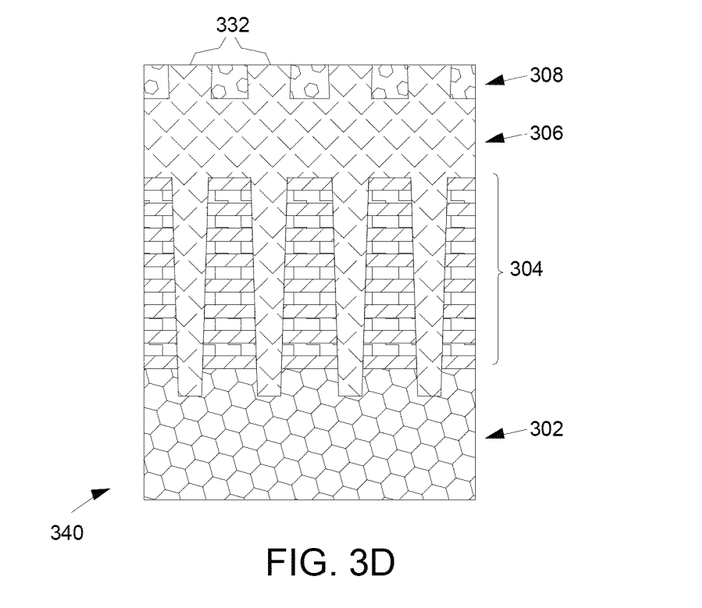

Referring to FIG. 3D, a chemical mechanical planarization (CMP) process is performed to provide the semiconductor device 340. The CMP process may be selective for the material of the hard mask layer 308, for example silicon nitride, and stop on the hard mask layer 308. Thus, the hard mask layer 308 may be exposed by the CMP process. The oxide 332 remains between the features previously etched in the hard mask layer 308.

Figure 3E:
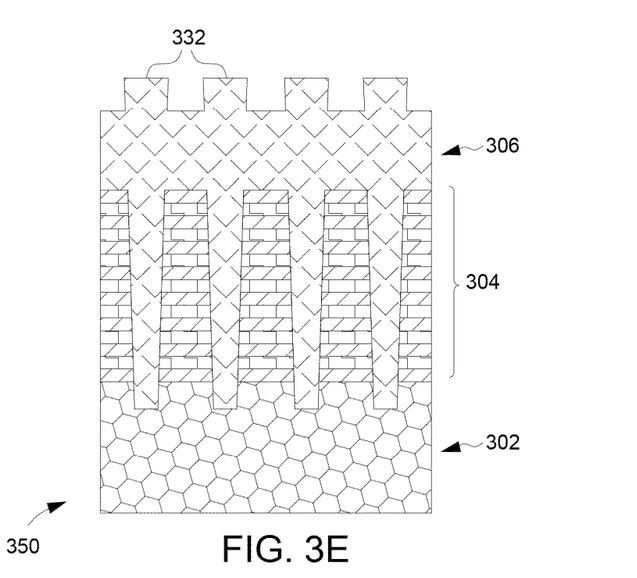

Referring to FIG. 3E, the hard mask layer 308 is removed to provide the semiconductor device 350. For example, if the hard mask layer 308 is silicon nitride, a hot phosphoric acid may be used for removal of the hard mask layer 308. As the recesses 322 are now filled in with the oxide 332, the high tensile strength of the hard mask layer 308 is no longer necessary to resist bending. Thus, the hard mask layer 308 may be removed and replaced with a material more preferable for later processing steps.

Figure 3F:
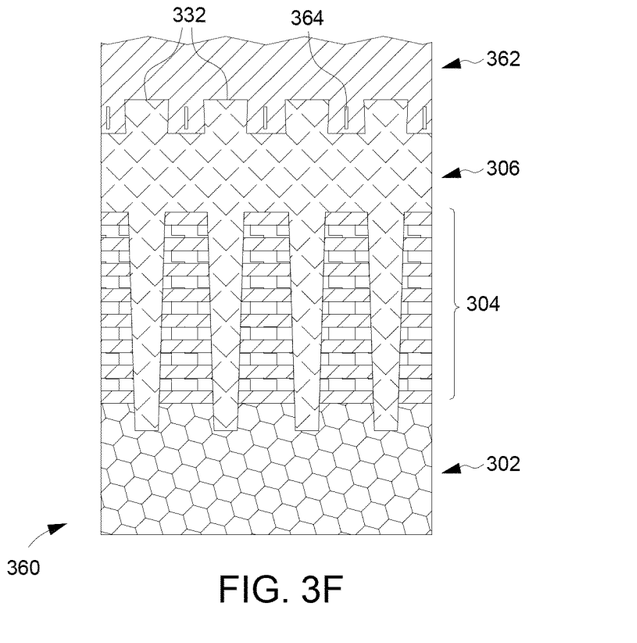

Referring to FIG. 3F, a second hard mask layer 362 is formed over the semiconductor device 350 to provide the semiconductor device 360. The second hard mask layer 360 may be formed using, for example, a deposition and may be a polysilicon layer As the material of the second hard mask layer 360 builds over the protruding portions of the oxide layer 332, a void 364 may be formed near a center of a recess between the protruding portions. The void 364 may also be partially or completely filled though a seam such as a difference or discontinuity in the crystalline structure of the second hard mask layer 360 may still be present in place of where the void 364 is shown (see, for example, FIG. 3G).

Figure 3G:
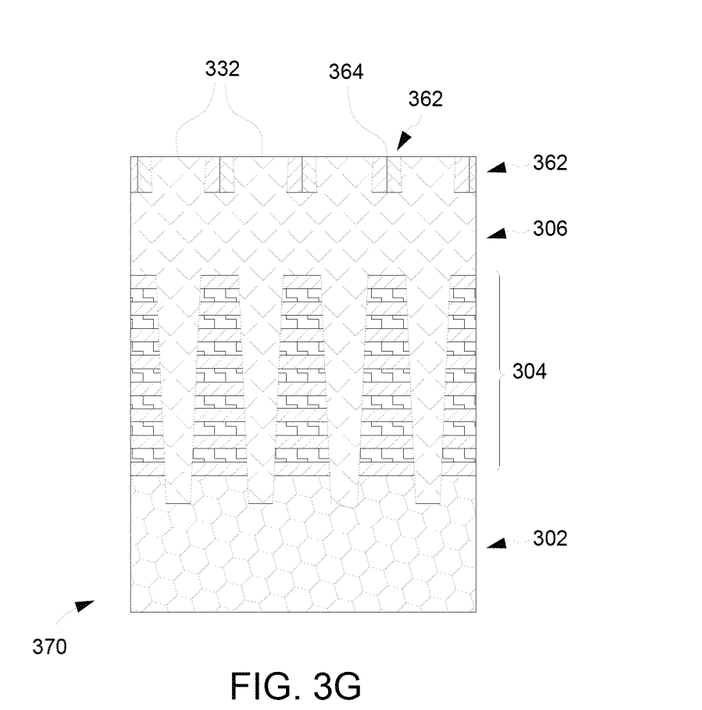

Referring to FIG. 3G, a CMP process is performed to provide the semiconductor device 370. The CMP process may be selective for the material of the oxide layer 332 and stop on the oxide layer 332. Thus, the oxide layer 332 may be exposed by the CMP process. The second hard mask layer 362 remains between the protruding portions of the oxide layer 332. FIG. 3G includes an example of an interface in place of the void 364. The interface includes two sides having different slopes. The interface may also include a void and/or a seam.

The above-described process of using a first hard mask with a high tensile strength (e.g., silicon nitride) and replacing the first hard mask with a second hard mask (e.g., polysilicon) with good selectivity to oxide may be particularly advantageous in semiconductor devices such as a 3D memory device. One exemplary advantage of replacing the first hard mask having a high tensile strength with a second hard mask with good selectivity to oxide is that bending, stringers and residues that can cause bridging leakage in the high aspect ratio structures during the bit line formation can be reduced or eliminated. Another exemplary advantage of replacing the first hard mask having a high tensile strength with a second hard mask with a good selectivity to oxide is that the thickness of the hard mask can be reduced lowering the aspect ratio and making the world line formation easier. Another exemplary advantage of replacing the first hard mask having a high tensile strength with a second hard mask with a good selectivity to oxide is that a damascene gate process can be used to reduce or eliminate stringers and residues that cause bridging leakage. In the case of the first hard mask being silicon nitride, the thickness of silicon nitride that would be needed to perform the damascene gate process due to its poor selectivity to oxide would significantly increase the thickness and aspect ratio of the device. Replacing the silicon nitride with a second hard mask that has good selectivity to oxide, such as polysilicon, allows for the gate damascene process to be used and the associated advantages (e.g., reduction or elimination of stringers and residues that cause bridging leakage) to be realized.

FIG. 4 show an exemplary memory device 400 that may be fabricated according to the above-described process. FIG. 4A is a top view; FIG. 4B is a cross-sectional view along the line A; FIG. 4C is a cross-sectional view along the line B; FIG. 4D is a cross-sectional view along the line C; and FIG. 4E is a cross-sectional view along the line D.

Figure 4A:
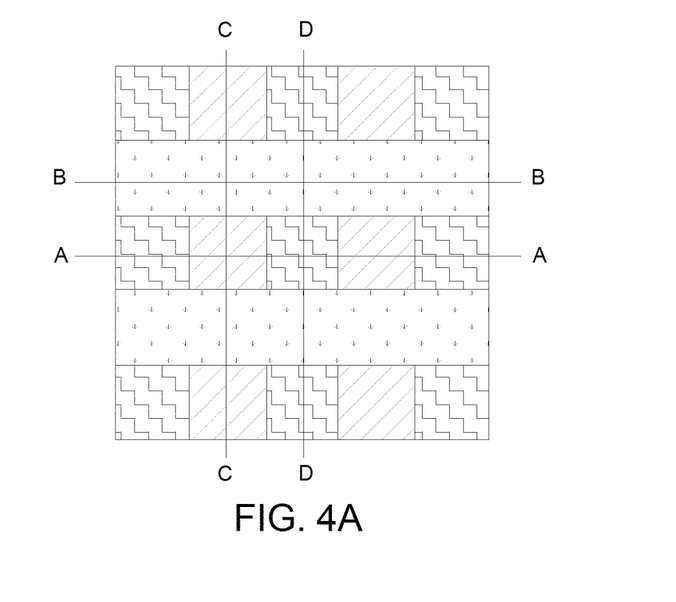
FIG. 4A is a top view of an exemplary memory device.
Figure 4B:
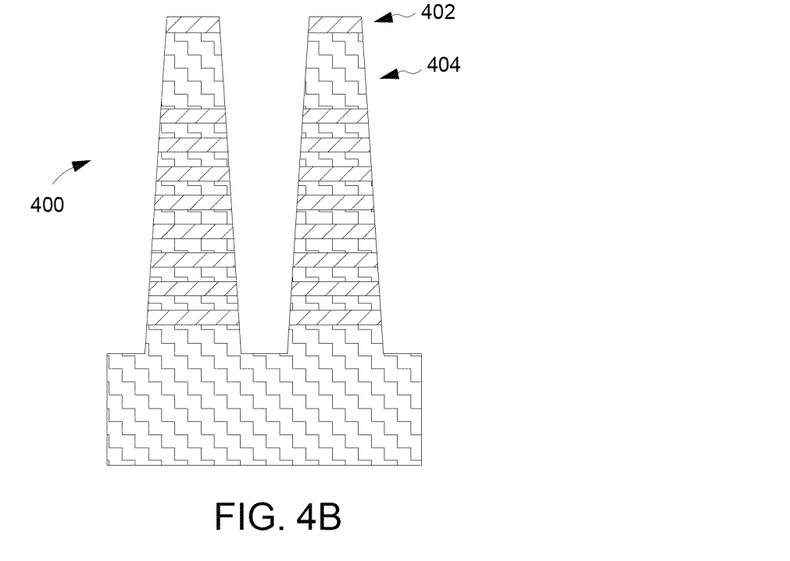
FIG. 4B is a cross-sectional view of the exemplary memory device of FIG. 4A along the line A.
Figure 4C:
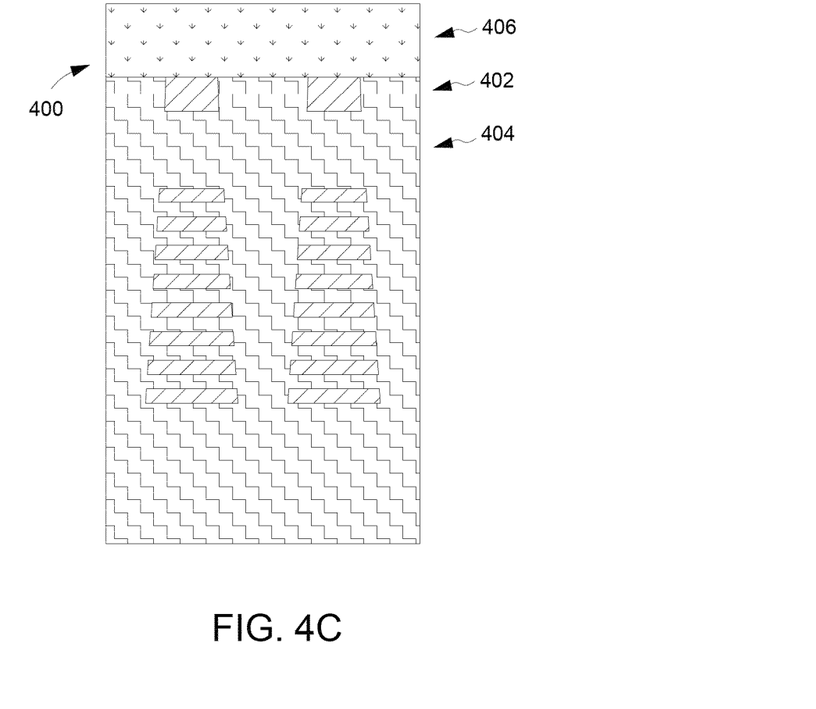
FIG. 4C is a cross-sectional view of the exemplary memory device of FIG. 4A along the line B.
Figure 4D:
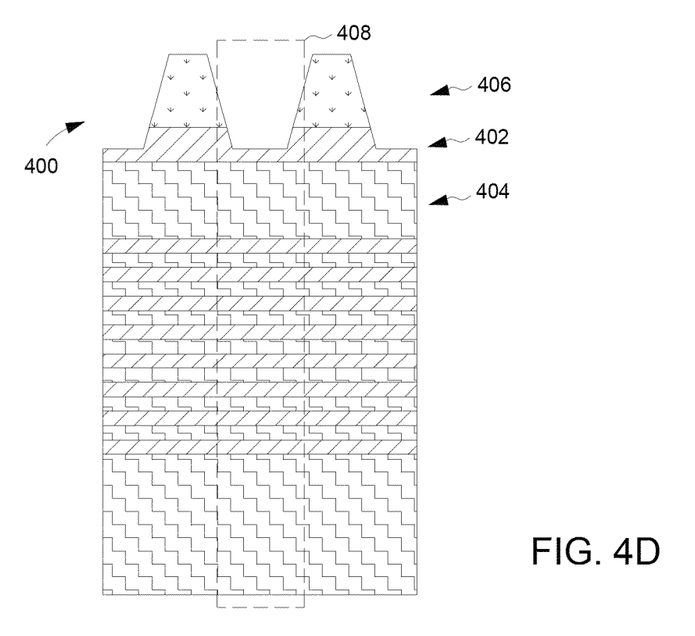
FIG. 4D is a cross-sectional view of the exemplary memory device of FIG. 4A along the line C.
Figure 4E:
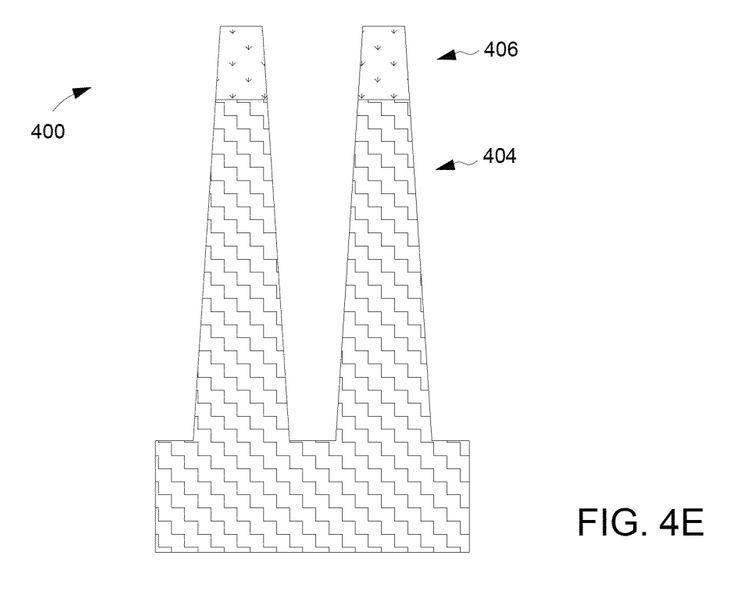
FIG. 4E is a cross-sectional view of the exemplary memory device of FIG. 4A along the line D.
Figure 5A:
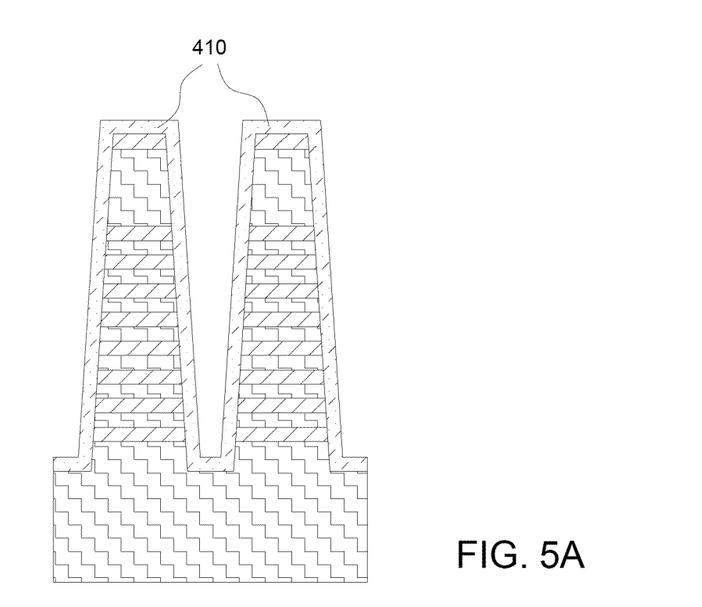
FIG. 5A is a cross-sectional view of the exemplary memory device of FIG. 4B after further processing.
Figure 5B:
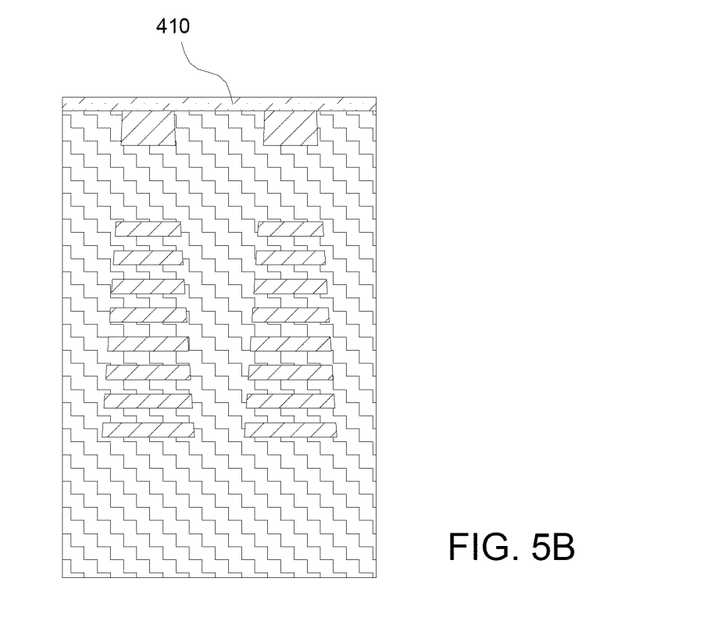
FIG. 5B is a cross-sectional view of the exemplary memory device of FIG. 4C after further processing.
Figure 5C:
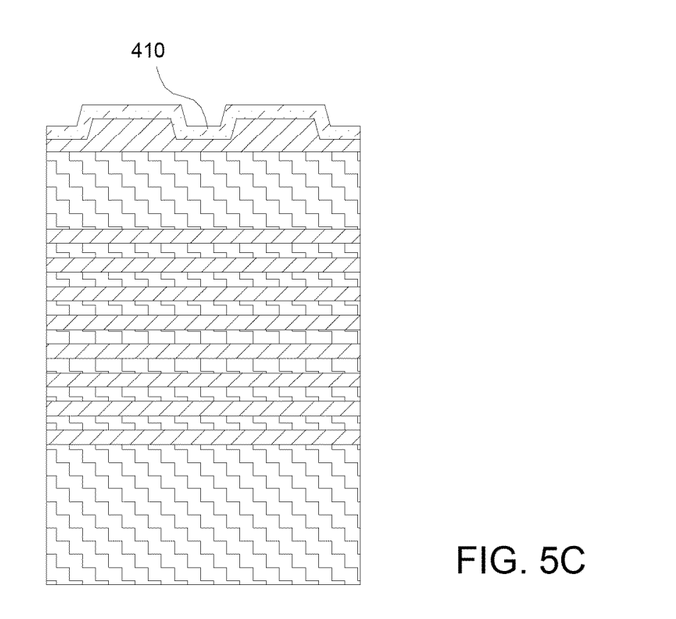
FIG. 5C is a cross-sectional view of the exemplary memory device of FIG. 4D after further processing.
Figure 5D:
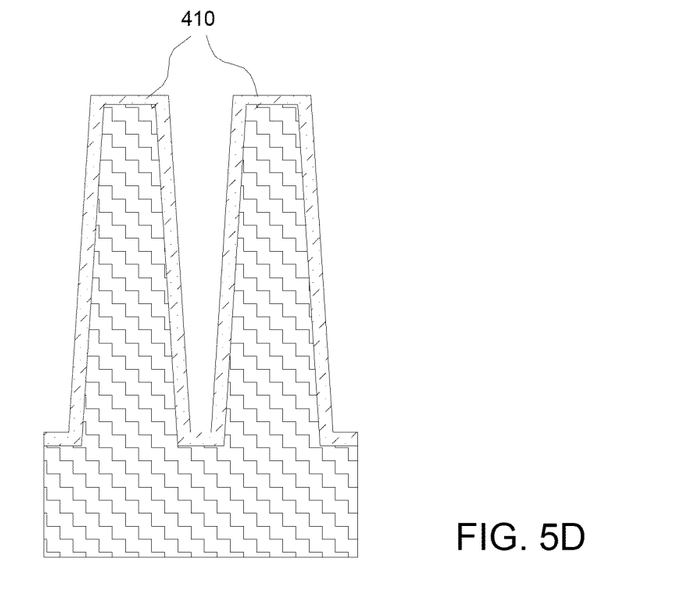
FIG. 5D is a cross-sectional view of the exemplary memory device of FIG. 4E after further processing.
Figure 6A:
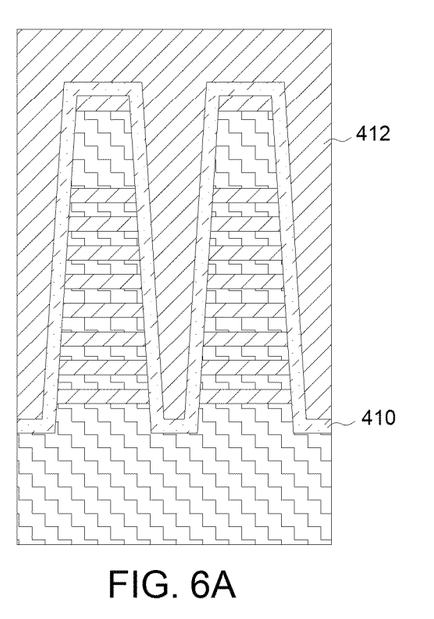
FIG. 6A is a cross-sectional view of the exemplary memory device of FIG. 5A after further processing.
Figure 6B:
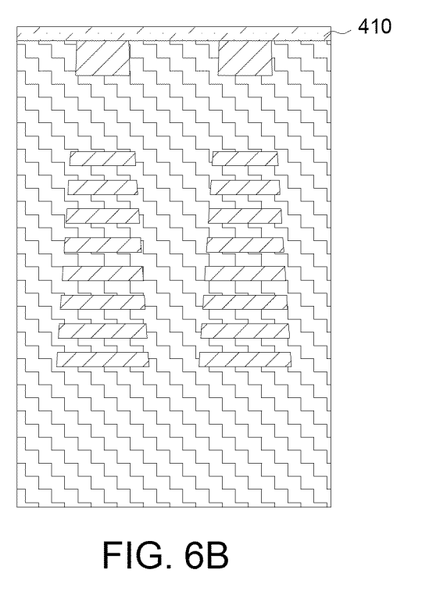
FIG. 6B is a cross-sectional view of the exemplary memory device of FIG. 5B after further processing.
Figure 6C:
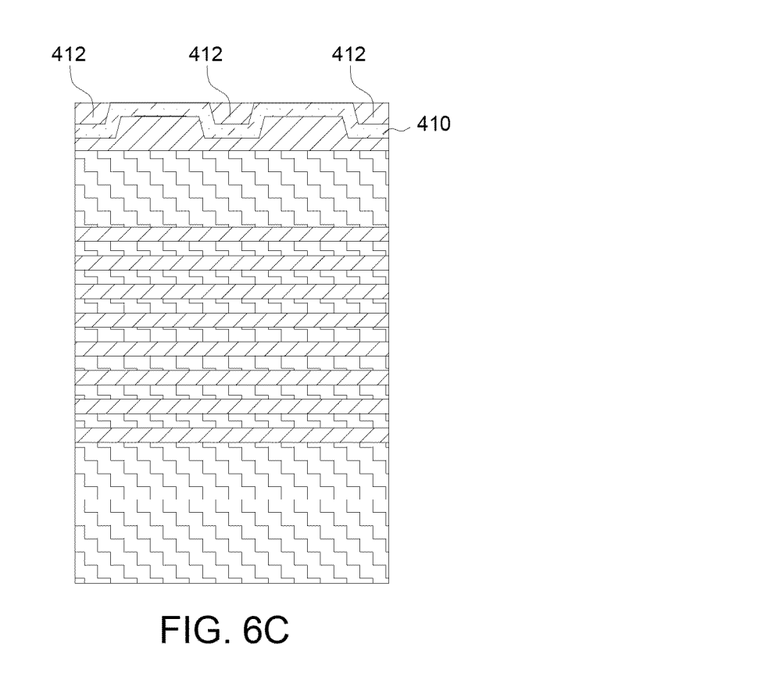
FIG. 6C is a cross-sectional view of the exemplary memory device of FIG. 5C after further processing.
Figure 6D:
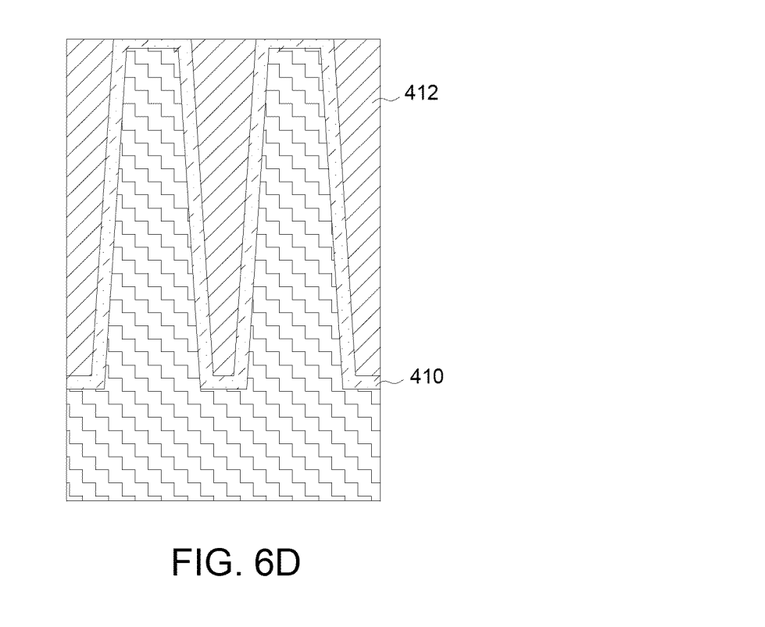
FIG. 6D is a cross-sectional view of the exemplary memory device of FIG. 5D after further processing.

After the above described process, the polysilicon hard mask 402 remains in the device 400. A photo resist layer 406 is formed and patterned for the formation of word lines, for example by a damascene word line etch. For reference, a word line coincides with the line B and a bit line corresponds with the line C. The photo resist layer 406 may be left after the formation of the word lines or it may be removed. The polysilicon hard mask 402 provides good selectivity to oxide (e.g., 404) in the word line etch. Thus, the polysilicon hard mask 402 protects the bit line profile (for example, the center portion of FIG. 4D marked with the dashed outline 408) against damage in the region.

Referring to FIG. 5, a stacked layer 410 such as oxide/nitride/oxide (ONO) layers (or, ONONO layers, etc), may be formed over the memory device 400 shown in FIG. 4. Referring to FIG. 6, a polysilicon layer 412 may be formed over the stacked layer 410. A CMP process that is selective for the stacked layer 410 (e.g., ONO), may also be performed.

In the formation of a memory device, the ONO dielectric (e.g., stacked layers 410) are preferably formed first, for example by deposition, before the polysilicon gate is filled in to provide isolation between the word lines.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Words of comparison, measurement, and time such as "at the time," "equivalent," "during," "complete," and the like should be understood to mean "substantially at the time," "substantially equivalent," "substantially during," "substantially complete," etc., where "substantially" means that such comparisons, measurements, and timings are practicable to accomplish the implicitly or expressly stated desired result.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A semiconductor device, comprising:
    a semiconductor layer, a vertical direction being defined normal to the semiconductor layer, and a horizontal direction being defined orthogonal to the vertical direction;
    a stacked structure formed over the semiconductor layer, the stacked structure including a plurality of first recesses in the vertical direction towards the semiconductor layer;
    an oxide layer formed over and between the stacked structure, the oxide layer including a second recess in the vertical direction towards the semiconductor layer, and the second recess being disposed horizontally between the first recesses and vertically above the stacked structure; and
    a polysilicon layer formed in the second recess of the oxide, the polysilicon layer including an internal interface in the recess.

2. The semiconductor device of claim 1, wherein the interface has a major axis parallel to the vertical direction.

3. The semiconductor device of claim 1, wherein the interface includes a void.

4. The semiconductor device of claim 1, wherein the interface includes a seam.

5. The semiconductor device of claim 4, wherein the seam includes a discontinuity in the crystalline structure of the polysilicon layer.

6. The semiconductor device of claim 1, wherein the stacked structure includes oxide-polysilicon-oxide layers.

7. The semiconductor device of claim 1, wherein the first recesses extend completely through the stacked structure in the vertical direction.

8. The semiconductor device of claim 7, wherein the first recesses extend into the semiconductor layer.

9. The semiconductor device of claim 1, wherein the oxide layer fills the first recesses.

10. The semiconductor device of claim 1, wherein the polysilicon layer is in contact with the oxide layer.

11. The semiconductor device of claim 1, wherein the interface is disposed in a region where the polysilicon layer meets itself.

12. The semiconductor device of claim 1, wherein the semiconductor layer includes an oxide layer.

* * * * *